(12) United States Patent
Werner et al.

(10) Patent No.: US 7,151,007 B2
(45) Date of Patent: Dec. 19, 2006

(54) DOPED ORGANIC SEMICONDUCTOR MATERIALS AND PROCESS FOR THEIR PREPARATION

(75) Inventors: Ansgar Werner, Dresden (DE); Fenghong Li, Dresden (DE); Martin Pfeiffer, Dresden (DE)

(73) Assignee: NovaLED GmbH, Dresden (DE)

( * ) Notice: Subject to any disclaimer, the term of this patent is extended or adjusted under 35 U.S.C. 154(b) by 115 days.

(21) Appl. No.: 10/920,062

(22) Filed: Aug. 17, 2004

(65) Prior Publication Data
US 2005/0061232 A1    Mar. 24, 2005

(30) Foreign Application Priority Data
Aug. 18, 2003   (DE) ................ 103 38 406

(51) Int. Cl.
*H01L 51/40*   (2006.01)
(52) U.S. Cl. ................ 438/99; 438/528; 257/E51.047; 257/E51.049; 257/E51.05
(58) Field of Classification Search ............ 438/99, 438/528
See application file for complete search history.

(56) References Cited

U.S. PATENT DOCUMENTS 5,093,698 A    3/1992   Egusa ................ 357/17

6,746,820 B1 *   6/2004   Furukawa ................ 430/281.1

OTHER PUBLICATIONS

Werner et al (Pyronin B as a donor for n-type doping of organic thin films), Applied Physics Letters, vol. 82, No. 25, pp. 4495-4497.*
Werner et al. (2003) "Pyronin B as a donor for *n*-type of organic thin films", Applied Physics Letters 82(25): 4495-4497.
Yokoi et al. (1999) "Photochemical doping of TCNQ by photoinduced electron transfer and C-C cleavage of radical cation", Chemistry Letters: 241-242.
Tang et al. (1987) "Organic electroluminescent diodes", Appl. Phys. Lett. 51(12): 913-915.

* cited by examiner

*Primary Examiner*—Alexander Ghyka
(74) *Attorney, Agent, or Firm*—Baker Botts LLP; Manu J. Tejwani

(57) ABSTRACT

The present invention relates to a process for the preparation of doped organic semiconductor materials having an increased charge carrier density and effective charge carrier mobility, by doping with a dopant, a process in which after mixing the dopant into the organic semiconductor material, hydrogen, carbon monoxide, nitrogen or hydroxyl radicals are split off and at least one electron is transferred to the semiconductor material or from the semiconductor material. The process is distinguished by the fact that an uncharged organic compound is used as dopant. Doped organic semiconductor materials are obtainable by one of the processes. The semiconductor materials are distinguished by the fact that the doped layer contains cations of at least one organic compound, the uncharged form of the organic compound being unstable in air.

12 Claims, 1 Drawing Sheet

DOPED ORGANIC SEMICONDUCTOR MATERIALS AND PROCESS FOR THEIR PREPARATION

CROSS-REFERENCE TO RELATED APPLICATIONS

The present application claims priority to German Patent Application No. 103 38 406.5, filed Aug. 18, 2003, which is incorporated herein by reference in its entirety.

BACKGROUND OF THE INVENTION

The present invention relates to doped organic semiconductor materials having an increased charge carrier density and effective charge carrier mobility, as well as to a process for preparing them by doping with a dopant, wherein, after mixing the dopant into the organic semiconductor material, hydrogen, carbon monoxide, nitrogen or hydroxy radicals are split off and at least one electron is transferred to the semiconductor material or from the semiconductor material.

Since the demonstration of organic light-emitting diodes and solar cells in 1989 (C. W. Tang et al., *Appl. Phys. Lett.*, 1987, 913), components constructed from thin organic layers have been the subject of intensive research. Such layers have advantageous properties for the uses mentioned, properties such as, e.g., efficient electroluminescence for organic light-emitting diodes, high absorption coefficients in the visible light region for organic solar cells, inexpensive preparation of the materials and of the production of components for the simplest electronic circuits, etc. The use of organic light-emitting diodes for display applications is already of commercial importance.

The performance characteristics of (opto)electronic multilayer components are determined, among other things, by the ability of the layers to transport the charge carriers. In the case of light-emitting diodes the ohmic losses in the charge transport layers during operation are related to the conductivity, which, on the one hand, has a direct effect on the required operating voltage, and on the other hand also determines the thermal load on the component. Furthermore, there develops, as a function of the charge carrier concentration of the organic layers, a band deformation in the vicinity of a metal contact, which can facilitate the injection of charge carriers and thereby reduce the contact resistance. In the case of organic solar cells, too, similar considerations lead to the conclusion that their efficiency is also determined by the transport characteristics for charge carriers.

By doping hole transport layers with a suitable acceptor material (p-doping) or electron transport layers with a donor material (n-doping) the charge carrier density in organic solids (and hence the conductivity) can be considerably increased. Moreover, in analogy to the experience with inorganic semiconductors, applications can be expected which are based precisely on the use of p- and n-doped layers in a component and which otherwise would not be conceivable. U.S. Pat. No. 5,093,698 describes the use of doped charge carrier transport layers (p-doping of the hole transport layer by admixture of acceptor-type molecules, n-doping of the electron transport layer by admixture of donor-type molecules) in organic light-emitting diodes.

Compared with doping processes with inorganic materials, which, on the one hand, lead to problems of diffusion of the doping material used in the form of relatively small molecules or atoms, and, on the other hand, to undesired unpredictable chemical reactions between matrix and doping material, the use of organic molecules as doping material has been found advantageous. In general, organic dopants show a higher stability of the components, and diffusion plays a subordinate role, so that the defined preparation of sharp transitions from p-doped to n-doped regions is simplified. On doping with organic molecules a charge transfer exclusively takes place between matrix and doping material, but no chemical bond is formed between the latter. Furthermore, in the case of organic dopants the doping concentration to obtain a high conductivity of the doped layer is, advantageously, about three to four orders of magnitude below that of inorganic dopants.

The use of organic dopants is disadvantageous in that the desired doping materials, which are distinguished by extreme electron affinities or reduction potentials for p-doping or corresponding ionization potentials or oxidation potentials for n-doping, have a low chemical stability and are difficultly accessible.

A. G. Werner et al., *Appl. Phys. Lett.*, 2003, 4495–7 shows the use of pyronine B as doping material for organic semiconductor materials. To this end, pyronine B chloride is sublimed, which essentially results in the formation of hydrogen chloride and a reduced, protonated form of pyronine B, namely the leuco base of pyronine B. The leuco base is used as a stable precursor substance which, through vacuum evaporation in the presence of a matrix material of low acceptor strength, is again oxidized to a cation.

A drawback of this process is due to the reaction to form the leuco form of the cationic dye. In this reaction, polymerization of pyronine B takes place, which results in an only limited sublimability of pyronine B chloride.

Furthermore, H. Yokoi et al., *Chemistry Letters*, 1999, 241–2, describes a photochemical doping of tetrafluorotetracyanoquinodimethane (TCNQ) by photo-induced electron transfer and C—C splitting of the radical cation, where TCNQ is mixed with dimers of the dopant, e.g., di(p-methoxyphenylamine)methyl, by grinding in a mortar. On illumination, oxidation of the dimer and electron transfer to TNCQ take place. During the oxidation, the C—C bond is split and a monomer cation and a monomer radical are formed. Through electron transfer to TCNQ, the monomer radical is oxidized to the cation.

This process is disadvantageous in so far as its use in vacuo is not possible and hence it cannot be used in combination with the usual organic semiconductor materials, such as, e.g., fullerene $C_{60}$. In principle, there is a direct reciprocal relationship between the stability of the dimer and that of the cation monomer, so that a cation monomer that is all the more stable is, as uncharged dimer, only of limited stability.

OBJECTS AND SUMMARY OF THE INVENTION

Hence, the object of the present invention is to improve the preparation of organic doped semiconductor materials with respect to yield and purity.

In accordance with the invention, this object is achieved by using a neutral organic compound as dopant. By using the hydrogenated form of an organic compound in contrast to the direct use of a salt of the organic compound, the polymerization problems and the action of by-products—such as, e.g., hydrogen chloride—are avoided.

In so doing, it is possible to use the hydrogenated form of an organic compound in the purified state and mix it directly into the organic semiconductor material. The hydrogenated forms of organic compounds are neutral, nonionic molecules, and for that reason undergo an essentially complete subliming, so that the effect of the by sublimation of the cationic dye formed is like the doping effect of the thus evaporated hydrogenated form of an organic compound.

More expediently, the dopant in the hydrogenated form of the organic compound is prepared by subliming a salt of the organic compound. Thus, the preparation of the hydrogenated form of the organic compound is a prior independent step in the absence of the organic semiconductor material. Moreover, further purification processes can be carried out to improve the yield and purity of the hydrogenated form of the organic compound.

During the doping, it is provided that the uncharged organic compound is converted into the cation or radical of the organic compound by splitting off hydrogen, carbon monoxide, nitrogen or hydroxy radicals. In this way, it is possible to effect an n-doping by transfer of an electron from the radical to the semiconductor material, or a p-doping through uptake of the cation from the semiconductor material.

In one embodiment of the invention, hydrogen, carbon monoxide, nitrogen and hydroxy radicals are split off from a cyclopentadiene, cycloheptatriene or a six-membered heterocycle. An electron donation (n-doping) or uptake (p-doping) is favored by the formation of a 6pi-aromatic system.

Alternatively or additionally, the cyclopentadiene, cycloheptatriene or six-membered heterocycle can be a component of a system of condensed rings, so that the formation of an 8pi-, 10pi-, 12pi- or another (2n)pi system also favors the electron transfer.

More advantageously, the uncharged organic compound is the carbinol base or leuco base of a cationic dye. Use of such molecules shows a high quantum efficiency of the light yield of organic light-emitting diodes. For example, cationic dyes, such as, e.g., rhodamine B, often have a high luminescence quantum yield, which permits later use as luminescence dyes in organic LED.

Alternatively, it is also possible to use xanthene, acridine, diphenylamine, triphenylamine, azine, oxazine, thiazine or thioxanthene dye derivatives as dyes. However, the choice of substances suitable for doping is not limited to cationic dyes. Also suitable, e.g., are substances which can, through splitting off of another group, be converted as hydride into the cation.

Further advantageous arrangements are disclosed by the subsidiary claims.

Furthermore, to solve the task by means of the process of the invention, doped organic semiconductor materials of increased charge carrier density and effective charge carrier mobility are prepared, wherein the doped layer contains cations of at least one organic compound whose uncharged form is unstable in air.

Further advantageous arrangements are disclosed by the subsidiary claims.

DESCRIPTION OF THE DRAWINGS

The invention is explained below on the basis of an embodiment represented in the drawing.

DESCRIPTION OF THE EMBODIMENT

In an embodiment of the process of the invention to prepare doped organic semiconductors, Crystal Violet is used as cationic dye.

In a first step, the dye, present as the chloride salt and hence stable, is first sublimed. In this step, hydrogen chloride is liberated. The uncharged reduced form of Crystal Violet is obtained as its leuco base 1 in a small yield.

The leuco base 1 is a precursor substance, from which the donor 2 is obtained in a second step. In the absence of UV radiation, the Leuco Crystal Violet 1 is stable in air. Leuco Crystal Violet 2 has an oxidation potential of 0.7 V against SCE. In general, materials having oxidation potentials of more than 0.3 V against SCE are kinetically stable, i.e., they are inert in air. The inertness of Leuco Crystal Violet 1 in air has a direct advantageous effect on the simplicity of handling the precursor substance of the donor. Thus, the leuco base can be used directly in the doping process.

For this purpose, the pure leuco base 1 is mixed into an organic semiconductor material of suitable acceptor strength, namely fullerene $C_{60}$. The doping concentration chosen is guided by the desired conductivity. Typical doping concentrations are in the range of 1:5,000 to 1:10, but they can also exceed 1:10.

Figure 1:
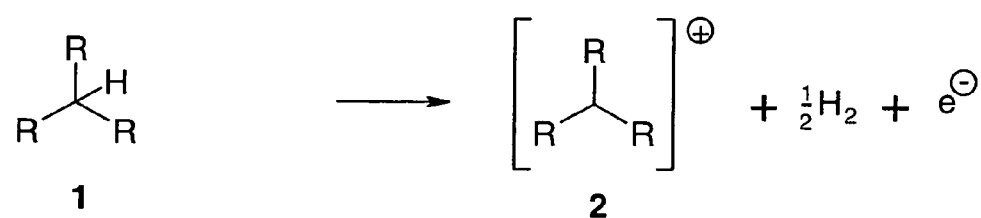
FIG. 1 shows the reaction, according to the invention, of Leuco Crystal Violet to form the Crystal Violet cation through oxidation.
Figure 1:
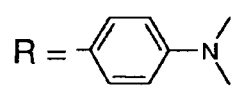

Finally, in a second step, the leuco base 1 is again oxidized to the cation, thereby producing the effect (FIG. 1). Thus, the Leuco Crystal Violet 1 reacts in the second step to form the donor 2. In this oxidation, the leuco base 1 reacts to form the Crystal Violet cation, transferring an electron to the semiconductor material fullerene, and splitting off hydrogen.

The Crystal Violet cation has a reduction potential of −0.1 V against NHE and is thus a decisively better donor 2 than all hitherto known organic donors that are stable in air. For this reason, cationic dyes are, in general, are particularly well suited for doping matrix materials having reduction potentials of less than 0 V against SCE, such as fullerene $C_{60}$.

What is claimed is:

1. A process for the preparation of doped organic semiconductor materials having an increased charge carrier density and effective charge carrier mobility, the process comprising:
   mixing a dopant with the organic semiconductor materials wherein an uncharged non-ionic organic compound is used as dopant, and wherein upon mixing the dopant into the organic semiconductor material the uncharged organic compound is converted into a cation or radical of the organic compound by splitting a molecular group comprising at least one of hydrogen, carbon monoxide, nitrogen or hydroxy radicals and such that at least one electron is transferred to or from the organic semiconductor material.

2. The process according to claim 1, wherein the dopant is prepared by subliming a salt of the organic compound.

3. The process according to claim 1, wherein the uncharged organic compound is converted, by splitting off hydrogen, carbon monoxide, nitrogen or hydroxy radicals, into the cation or radical of the organic compound.

4. The process according to claim 1, wherein the hydrogen, carbon monoxide, nitrogen or hydroxy radicals are split off from a cyclopentadiene, cycloheptatriene or a six-membered heterocycle, with formation of a 6pi-aromatic system.

5. The process according to claim 4, wherein the cyclopentadiene, cycloheptatriene or the six-membered heterocycle is a component of a system of condensed rings.

6. The process according to claim 1, wherein the uncharged organic compound is the carbinol base or leuco base of a cationic dye.

7. The process according to claim 6, wherein a xanthene, acridine, diphenylamine, triphenylamine, azine, oxazine, thiazine or thioxanthene dye derivative is used as dye.

8. The process according to claim 1, wherein before or after mixture into the organic semiconductor material, the uncharged organic compound is illuminated or stimulated with an electron ray.

9. The process according to claim 8, wherein the spectrum of the radiation used for illumination at least partially overlaps the absorption region of the neutral compound and/or of that of the semiconductor material to be doped.

10. The process according to claim 1, wherein at least one charge is transferred between the dopant and the organic semiconductor material, without formation of a chemical bond.

11. The process according to claim 1, wherein the organic semiconductor material is doped by mixed vaporization or successive vaporization with a cationic dye or its leuco base or carbinol base, and that the compound formed from the cationic dye is, by irradiation with an electron ray or illumination in the absorption region of the organic semiconductor material and/or of the resulting compound, again converted into the cation.

12. The process according to claim 1, wherein an inhomogenously doped layer is produced, the organic semiconductor material and the dopant showing redox potentials mutually coordinated in such a way that the compound in the matrix is inert in darkness.

* * * * *